(12) United States Patent
Heo

(10) Patent No.: US 7,557,905 B2
(45) Date of Patent: Jul. 7, 2009

(54) WAFER LOADING APPARATUS

(75) Inventor: Sung-Soo Heo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 336 days.

(21) Appl. No.: 11/384,322

(22) Filed: Mar. 21, 2006

(65) Prior Publication Data
US 2006/0244276 A1    Nov. 2, 2006

(30) Foreign Application Priority Data
Apr. 14, 2005   (KR) ................ 10-2005-0031155

(51) Int. Cl.
*G03B 27/58* (2006.01)
*B25B 11/00* (2006.01)
(52) U.S. Cl. .......................... 355/72; 269/8
(58) Field of Classification Search .......... 355/72, 355/73, 75, 76; 269/20, 21, 8
See application file for complete search history.

(56) References Cited

U.S. PATENT DOCUMENTS 6,172,738 B1 * 1/2001 Korenaga et al. ............. 355/53
6,305,677 B1 * 10/2001 Lenz ............................ 269/13
6,805,338 B1 * 10/2004 Okuda ......................... 269/21

FOREIGN PATENT DOCUMENTS

| JP | 06-196381 | 7/1994 |
| KR | 100238946 | 10/1999 |
| KR | 1020010026929 | 4/2001 |

* cited by examiner

*Primary Examiner*—Diane I Lee
*Assistant Examiner*—Ryan Howard
(74) *Attorney, Agent, or Firm*—Volentine & Whitt, PLLC

(57) ABSTRACT

A wafer loading apparatus comprises a plate adapted to support a wafer, and a plurality of protrusion elements located within the plate. The protrusion elements partially extrude above the plate to support the wafer. The wafer loading apparatus further comprises a plurality of control elements formed under the protrusion elements to control movement of the protrusion elements such that a distance between a lower surface of the wafer and an upper surface of the plate is substantially uniform.

8 Claims, 4 Drawing Sheets

WAFER LOADING APPARATUS

BACKGROUND OF THE INVENTION

1. Field of the Invention

Embodiments of the present invention relate generally to a semiconductor manufacturing apparatus. More particularly, embodiments of the invention relate to a wafer loading apparatus adapted to prevent local defocus in the semiconductor manufacturing apparatus.

A claim of priority is made to Korean Patent Application No. 2005-31155, filed on Apr. 14, 2005, the disclosure of which is hereby incorporated by reference in its entirety.

2. Description of Related Art

Semiconductor manufacturing apparatuses commonly use photolithography processes to form patterns on the surface of a wafer. A photolithography process generally includes a number of processing steps, which are performed in a sequence. The processing steps may include, for example, substrate preparation, photoresist application, soft-baking, exposure, developing, hard-baking, and etching.

Since these processing steps are generally performed in a sequence, errors in early processing steps tend to cause problems in later steps. For example, if photoresist application is performed incorrectly, soft-baking, exposure, and so forth will also be affected.

One problem that commonly occurs in the exposure step of photolithography processes is known as "local defocus". Simply stated, the "local defocus" problem occurs when the light used to expose the photoresist in the exposure process is out of focus in some local region of a wafer. One way that local defocus can occur is where the wafer itself has local distortions (See, for example, FIG. 4). One source of local distortions of the wafer is contamination particles deposited on a wafer loading apparatus. The contamination particles can cause the local distortions in the wafer by pushing upwards on the wafer.

Local defocus can be prevented by frequently cleaning the surface of the wafer loading apparatus where the wafer is mounted. However, frequently cleaning the wafer loading apparatus takes a significant amount of time and tends to deteriorate the efficiency and productivity of the semiconductor manufacturing apparatus. As a result, frequently cleaning the wafer loading apparatus is not a desirable solution for reducing local defocus.

Another way to reduce local defocus is to include a plurality of protrusion elements (also referred to as pimples or burls) in the wafer loading apparatus to reduce the surface contact area between the wafer loading apparatus and a loaded wafer. By reducing the surface contact area between the wafer loading apparatus and the loaded wafer, the amount of contamination that touches the loaded wafer is greatly reduced. Unfortunately, this method cannot entirely eliminate local defocus caused by particles on the wafer loading apparatus because portions of the protrusion elements in contact with the wafer may still contain particles.

Referring to FIGS. 1 and 2, a conventional wafer loading apparatus 10 in a wafer alignment and exposure device comprises a plate 16 including an edge area 14 and a center area including a plurality of protrusion elements 20. Wafer loading apparatus 10 further comprises a plurality of support pins 12 adapted to support a wafer.

Protrusion elements 20 define an even contact plane adapted to support a bottom surface of a loaded wafer for an exposure process.

Referring to FIG. 3, wafer loading apparatus 10 includes protrusion elements 20a and 20b extending from respective top and bottom surfaces of plate 16. Protrusion elements 20a support the loaded wafer, while protrusion elements 20b contact a chuck (not shown), which holds plate 16.

As shown in FIG. 4, a particle 4 located on one of protrusion elements 20 distorts the contact plane between a wafer 2 and the wafer loading apparatus. The distorted contact plane causes local defocus in a subsequent exposure process, which may cause a bridge or an abnormal photoresist pattern to form on the loaded wafer.

Local defocus occurs on a regular basis in alignment and exposure devices such as those illustrated in FIGS. 1 through 4. For example, Table 1 shows instances of local defocus that occurred in a semiconductor manufacturing apparatus between Jun. 1, 2004 and Sep. 30, 2004. The average number of local defocus problems and damaged wafers per month as shown by Table 1 is 253 and about 578, respectively, and about 9 to 10 wafers are damaged per each local defocus occurrence.

As suggested by Table 1, the conventional wafer loading apparatus is highly susceptible to process defects and wafer damage resulting from local defocus. Because of this, the local defocus problem tends to undermine the productivity of semiconductor manufacturing apparatuses that include the conventional wafer loading apparatus.

TABLE 1

| Inspection Period (Year of 2004) | Number of Occurrences of Local Defocus | Number of Wafers Contaminated |
|---|---|---|
| June 1~June 30 | 195 | 512 |
| July 1~July 31 | 159 | 413 |
| August 1~August 31 | 394 | 888 |
| September 1~September 30 | 264 | 500 |

SUMMARY OF THE INVENTION

Embodiments of the present invention address the problem of eliminating local defocus in an exposure process of a semiconductor manufacturing apparatus by providing an improved wafer loading apparatus. The improved wafer loading apparatus leads to improved productivity of the semiconductor manufacturing apparatus.

According to one embodiment of the present invention, a wafer loading apparatus comprises a plate adapted to support a wafer, a plurality of protrusion elements located within the plate and partially extruding above the plate to support the wafer, and a plurality of control elements formed under the protrusion elements to control movement of the protrusion elements such that a distance between a lower surface of the wafer and an upper surface of the plate is substantially uniform.

According to another embodiment of the invention, a wafer loading apparatus comprises an upper plate including a plurality of penetrating holes, a plurality of supporting elements having respective upper portions surrounded by the penetrating holes and adapted to support a wafer loaded on the upper plate, and a bottom plate located below the upper plate and surrounding lower portions of the supporting elements. The bottom plate includes a plurality of recesses respectively aligned with the penetrating holes. The wafer loading apparatus further comprises a plurality of control elements respectively located in the plurality of recesses and adapted to control vertical movement of the respective supporting elements such that a distance between the lower surface of the wafer and an upper surface of the upper plate remains substantially uniform whenever the wafer is placed on the supporting elements.

BRIEF DESCRIPTION OF THE DRAWINGS

The invention is described below in relation to several embodiments illustrated in the accompanying drawings.

Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. In this written description, whenever an element such as a layer, film, region, or substrate referred to as being "on" another element, it can be directly on the other element or intervening elements may also be present.

Figure 1:
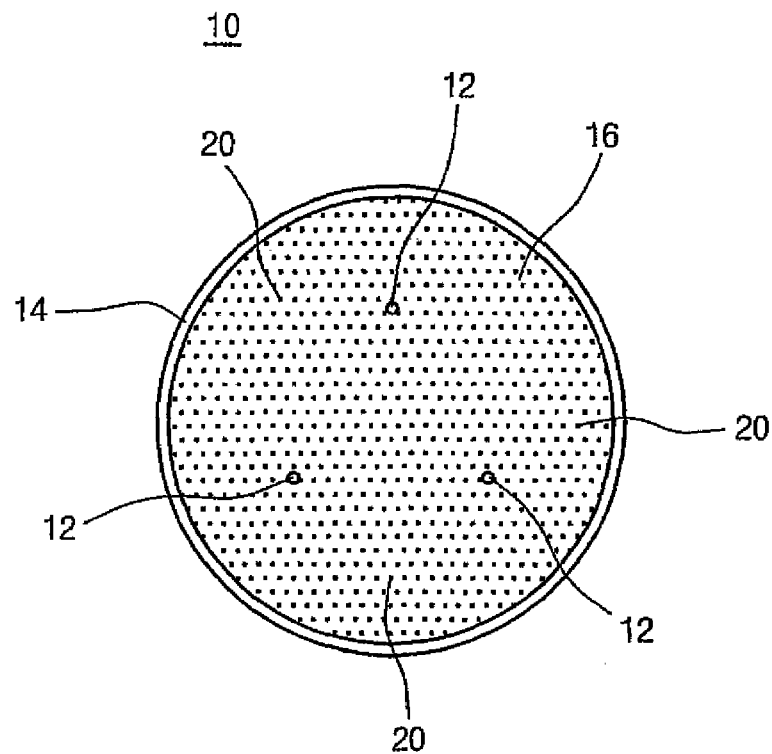
FIG. 1 is a plan view illustrating a conventional wafer loading apparatus including a plurality of protrusion elements.
Figure 2:
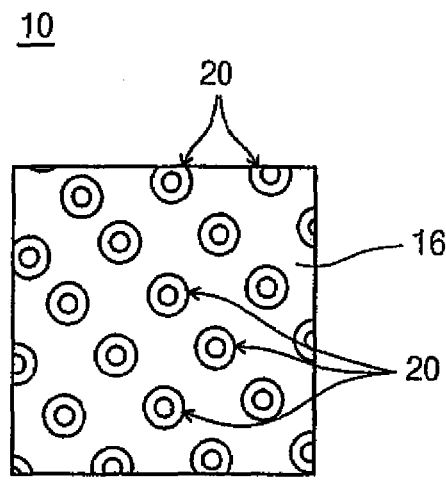
FIG. 2 is a partially enlarged view illustrating the wafer loading apparatus of FIG. 1.
Figure 3:
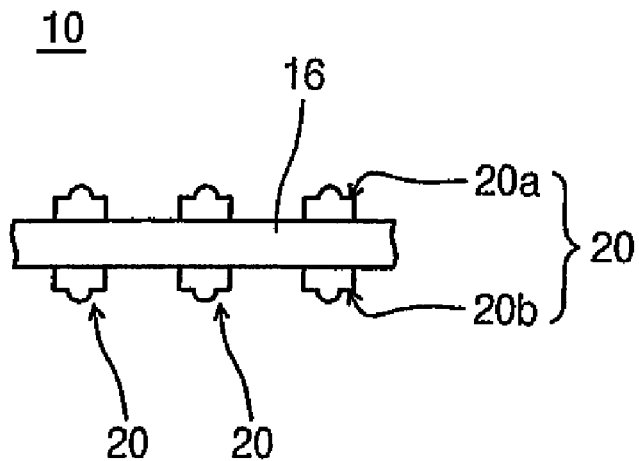
FIG. 3 is a partially cut-away sectional view of the wafer loading apparatus of FIG. 1.
Figure 4:
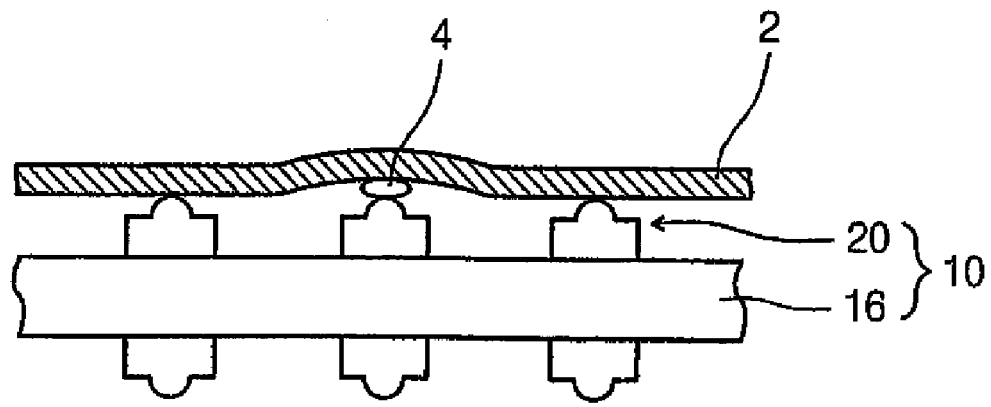
FIG. 4 is a sectional view illustrating a deformation of a loaded wafer due to a particle on a protrusion element of the wafer loading apparatus of FIG. 1.
Figure 5:
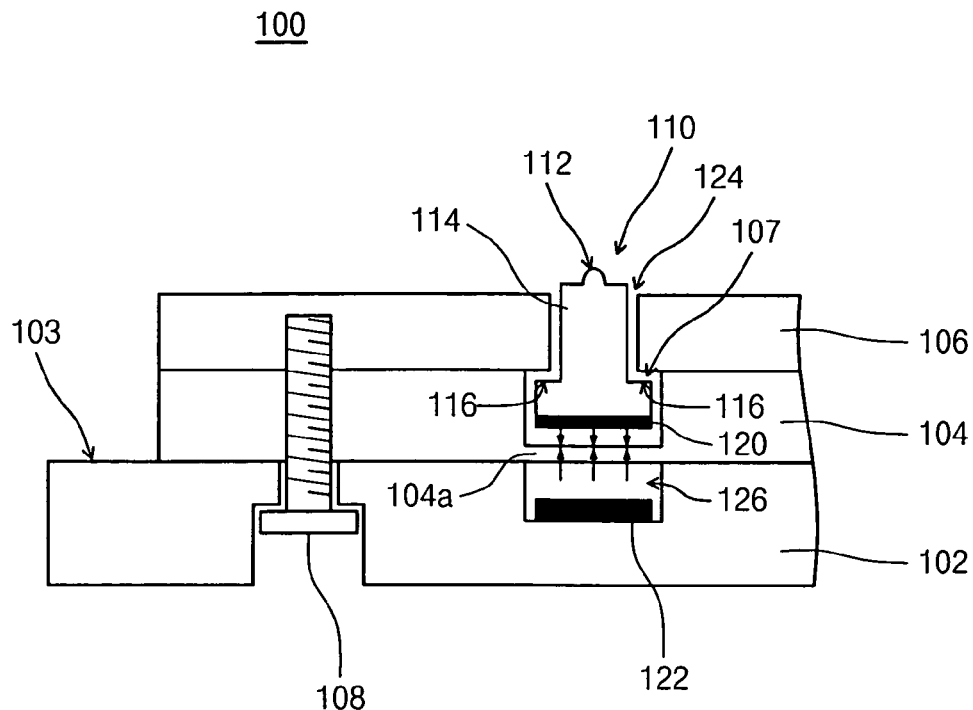
FIG. 5 is a cross-sectional view illustrating a wafer loading apparatus according to one embodiment of the present invention.

FIG. 5 is a cross-sectional view of a wafer loading apparatus according to one embodiment the present invention. Referring to FIG. 5, a wafer loading apparatus 100 includes a protrusion element (or supporting element) 110, and control elements 120 and 122 positioned below protrusion 110. Control devices 120 and 122 vertically adjust protrusion element 110 such that an upper surface of protrusion element 110 has substantially the same height as respective upper surfaces of other similar protrusion elements (See, FIG. 6) in wafer loading apparatus 100.

Wafer loading apparatus 100 further comprises a plurality of plates adapted to hold protrusion element 110 and control devices 120 and 122. The plates include a bottom plate 102, a connecting plate 104 located on bottom plate 102, and an upper plate 106 located on connecting plate 104. The plates are connected by a combining member 108 to form a multilayer structure.

Although not shown in FIG. 5, wafer loading apparatus 100 generally further comprises a wafer table and a wafer chuck for carrying out a photolithography process.

Upper plate 106 includes a penetrating hole 124 surrounding an upper portion of protrusion element 110. Similarly, connecting plate 104 includes a recess 107 located below penetrating hole 124 and surrounding a lower portion of protrusion element 110. Recess 107 has a larger diameter than penetrating hole 124. Finally, bottom plate 102 includes a caging recess 126 formed below penetrating hole 124.

Protrusion element 110 comprises a body portion 114, an extruding portion 112, and a separation-preventing portion 116. Body portion 114 resides in penetrating hole 124, and separation-preventing portion 116 resides in caging recess 107. Separation-preventing portion 116 has a larger diameter than body portion 114 to prevent protrusion element 110 from becoming separated from wafer loading apparatus 100. In other words, separation-preventing portion 116 has a diameter that is too big to pass through penetrating hole 124. Extruding portion 112 is integrally connected to body portion 114 and makes contact with the lower surface of a wafer that is placed on wafer loading apparatus 100.

Control elements 120 and 122 preferably comprise respective first and second magnets 120 and 122. First magnet 120 is attached to a bottom surface of protrusion 110 and second magnet 122 is placed onto a bottom surface of caging recess 126. First and second magnets 120 and 122 face each other at distance between recess 107 and caging recess 126, and the facing surfaces of first and second magnets 120 and 122 have the same polarity. In addition, first and second magnets 120 and 122 are separated by a portion 104a of connecting plate 104 located between recess 107 and caging recess 126.

The facing surfaces of first and second magnets 120 and 122 typically have the same area as each other. However, they may have different areas, depending on a desired magnetic force between the opposing faces of first and second magnets 120 and 122. Preferably, the magnetic force causes protrusion element 110 to float such that its upper surface has the same height as the upper surfaces of other similar protrusion elements in wafer loading apparatus 100. In other words, the repulsive force between the opposing faces of first and second magnets 120 and 122 is preferably adjusted so that protrusion element floats at an appropriate level.

Figure 6:
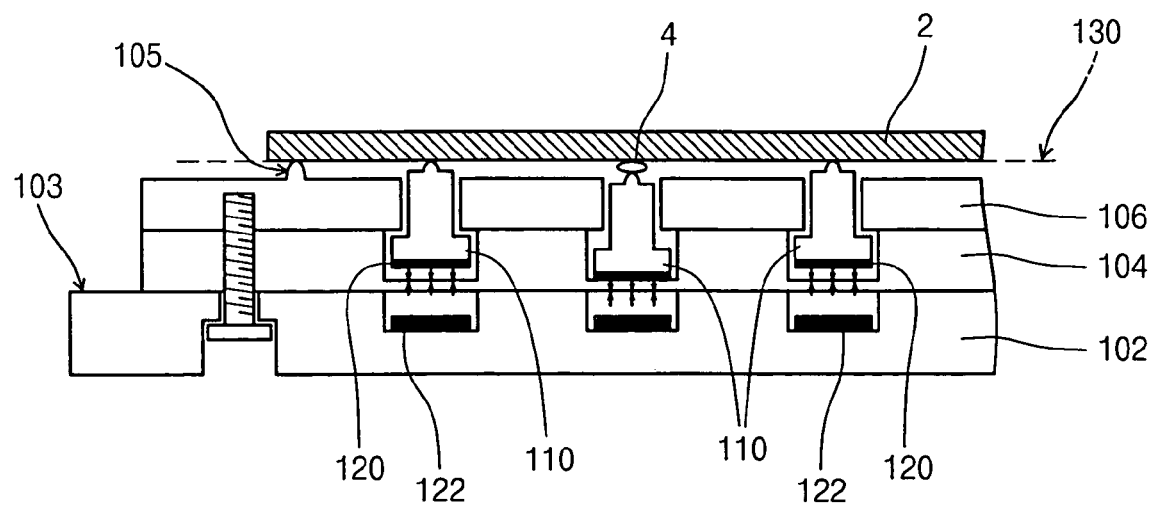
FIG. 6 is a cross-sectional view illustrating a shape of a loaded wafer on the wafer loading apparatus of FIG. 5 when a protrusion element of the wafer loading apparatus has a particle on it; and, FIG. 7 is a cross-sectional view illustrating a wafer loading apparatus according to another exemplary embodiment of the present invention.

FIG. 6 is a cross-sectional view illustrating the shape of a loaded wafer on wafer loading apparatus 100 where one of protrusion elements 110 has a particle 4 on top of it.

Referring to FIG. 6, particle 4 is located on one of protrusion elements 110 such that it makes contact with a wafer 2, which is loaded on wafer loading apparatus 100. Before wafer 2 is placed on wafer loading apparatus 100, the upper surface of particle 4 will be above the upper surfaces of protrusion elements 110 that do not have any particles on them. Accordingly, when wafer 2 is placed on wafer loading apparatus 100, the weight of wafer 2 will be more concentrated on the protrusion element 110 with particle 4 than on the other protrusion elements 110.

The weight of wafer 2 exceeds the repulsive force between first and second magnets 120 and 122, and therefore the protrusion element 110 with particle 4 on its top will fall down so that the upper surface of particle 4 is level with the upper surfaces of other protrusion elements 110 which do not have any particles on top of them.

In sum, in wafer loading apparatus 100, the heights of protrusion elements 110 are individually adjusted whenever particles are present thereon. As a result, wafer loading apparatus 100 provides an even contact surface 130, which prevents the local defocus problem from occurring in an exposure process.

Figure 7:
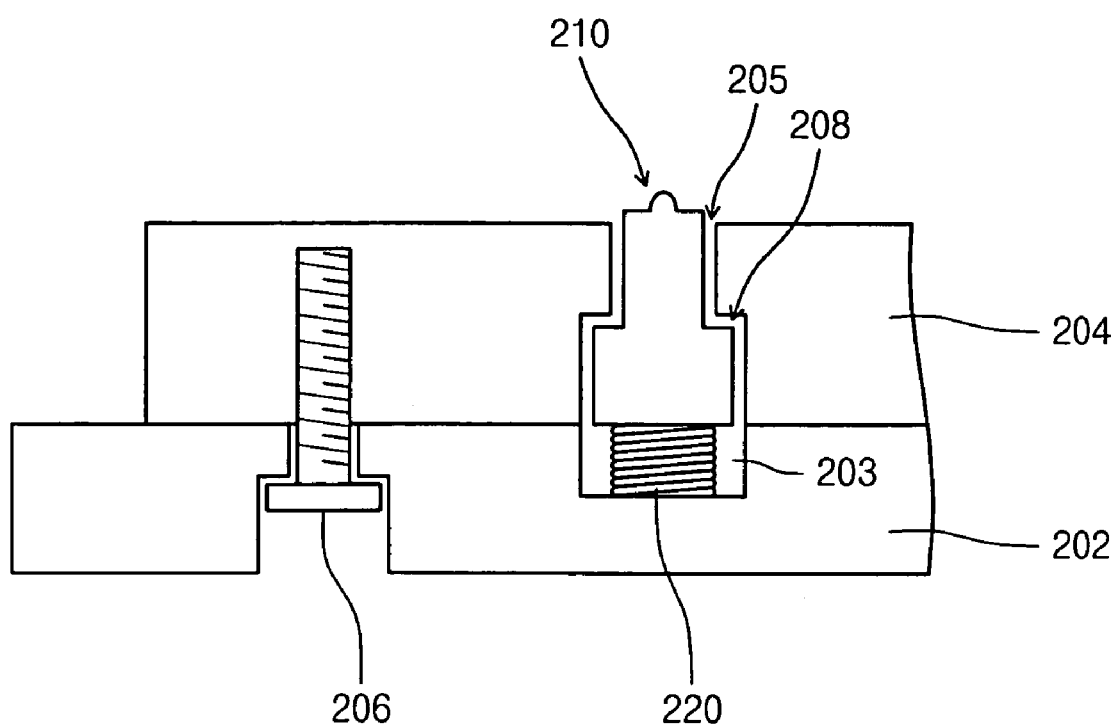

FIG. 7 is a cross-sectional view illustrating a wafer loading apparatus according to another exemplary embodiment of the present invention.

Referring to FIG. 7, a wafer loading apparatus 200 includes a lower plate 202 and an upper plate 204 formed on lower plate 202. Lower plate 202 is connected to upper plate 204 by a combining member 206.

A recess 203 is formed in lower and upper plates 202 and 204, and a penetrating hole 205 is formed in upper plate 204 above recess 203. An upper portion of a protrusion element 210 is located in penetrating hole 205, and a lower portion 208 of protrusion element 210 is located in recess 203. A control element 220 adapted to control the height of protrusion element 210 is formed in recess 203 below protrusion element 210.

Although FIG. 7 shows only one recess 203, one penetrating hole 205, and one protrusion element 210, wafer loading apparatus 200 may include multiple recesses, penetrating holes, and protrusion elements. In general, each of the recesses, penetrating holes, and protrusion elements will be similar to those shown in FIG. 7. Accordingly, a description of these additional features has been omitted to avoid redundancy.

Control element 220 typically includes a spring adapted to control the movement of protrusion element 210 in wafer loading apparatus 200. Here, protrusion element 210 has the same structure as protrusion element 110 in FIG. 5. However, in FIG. 7, one end of control element 220 is directly coupled to a bottom surface of protrusion element 210.

Recess 203 and penetrating hole 205 both have cylindrical shapes, where the diameter of recess 203 is larger than the diameter of penetrating hole 205. Lower portion 208 of protrusion element 210 also has a larger diameter than penetrating hole 205 to prevent protrusion element 210 from becoming separated from wafer loading apparatus 200.

A lower end of control element 220 is attached to a bottom surface of recess 203, and an upper end of control element 220 makes contact with a bottom surface of protrusion element 210. In a resting state, control element 220 supports protrusion element 210 at a desired height above upper plate 204. Control element 220 uses elastic force to adjust the position of protrusion element 210 according to the weight bearing down thereon.

Instead of including control element 220, wafer loading apparatus 200 could include first and second magnets such as those illustrated in FIGS. 5 and 6. For instance, the first magnet could be attached to the bottom surface of protrusion element 210 and the second magnet could be attached to the bottom surface of recess 203.

Where wafer loading apparatus 200 includes the first and second magnets, the magnets are preferably aligned so that a lower surface of the first magnet has the same polarity as an upper surface of the second magnet, which it faces.

As described above, a wafer loading apparatus according to selected embodiments of the present invention uses control elements to control the individual heights of protrusion elements above a plate. By controlling the individual heights of the protrusion elements, the wafer loading apparatus provides an even contact surface between a bottom of a wafer and the wafer loading apparatus.

In particular, where a particle is deposited on the top of one of the protrusion elements, the weight load of the wafer will be concentrated on that protrusion element. The protrusion element will respond to the concentrated weight by moving downward under the control of the control elements.

By adjusting the heights of the protrusion elements to provide an even contact surface for wafers that are placed on the wafer loading apparatus, embodiments of the present invention prevent local defocus from occurring in exposure processes performed on the wafer. By preventing the local defocus problem, the productivity and manufacturing efficiency of a semiconductor manufacturing system including the wafer loading apparatus is improved.

The foregoing preferred embodiments are teaching examples. Those of ordinary skill in the art will understand that various changes in form and details may be made to the exemplary embodiments without departing from the scope of the present invention as defined by the following claims.

What is claimed:

1. A wafer loading apparatus, comprising:
  a plate adapted to support a wafer, wherein the plate comprises:
    a plurality of protrusion elements disposed within the plate and partially extruding above the plate to support the wafer;
    an upper plate including a plurality of penetrating holes, each surrounding an upper portion of one of the plurality of protrusion elements to prevent the one protrusion element from becoming separated from the upper plate;
    a connecting plate disposed below the upper plate and Including a plurality of recesses respectively aligned with the plurality of penetrating holes and each surrounding a lower portion of one of the plurality of protrusion elements, wherein each of the lower portions of the plurality of protrusion elements has a larger diameter than a corresponding upper portion;
    a bottom plate including a plurality of caging recesses respectively disposed below the plurality of recesses; and
  a plurality of magnetic control elements, each respectively disposed under a corresponding one of the plurality of protrusion elements to control movement of the plurality of protrusion elements, such that a distance between a tower surface of the wafer and an upper surface of the plate is substantially uniform,
  wherein the plurality of magnetic control elements comprises,
    a plurality of lower magnetic control elements, each disposed in a corresponding one of the plurality of caging recesses, and
    a plurality of upper magnetic control elements, each disposed on a bottom surface of a corresponding one of the plurality of protrusion elements.

2. The wafer loading apparatus of claim 1, wherein the upper and lower magnetic control elements are arranged such that each upper magnetic control element has a magnetic face with a first polarity that points toward a magnetic face of a corresponding lower magnetic control element also having the first polarity.

3. The wafer loading apparatus of claim 1, wherein each of the plurality of protrusion elements comprises:
  a body portion surrounded by one of the plurality of penetrating holes in the upper plate;
  an extruding portion formed on a top surface of the body portion and extruding above the upper plate to support the wafer; and,
  a separation-preventing portion integrally formed with the body portion and surrounded by one of the plurality of recesses in the connecting plate.

4. A wafer loading apparatus, comprising;
  a plate adapted to support a wafer, wherein the plate comprises:
    a plurality of protrusion elements disposed within the plate and partially extruding above the plate to support the wafer;
    an upper plate including a plurality of penetrating holes surrounding respective upper portions of the plurality of protrusion elements to prevent the protrusion elements from becoming separated from the upper plate;
    a bottom plate including a plurality of recesses respectively aligned with the plurality of penetrating holes and surrounding respective lower portions of the plurality of protrusion elements, wherein each one of the plurality of recesses has a larger diameter than a corresponding one of the plurality of penetrating hole; and
  a plurality of magnetic control elements, each one of the magnetic control elements being respectively disposed under a corresponding one of the plurality of protrusion elements to control movement of the plurality of protrusion elements, such that a distance between a lower surface of the wafer and an upper surface of the plate is substantially uniform;
  wherein at least one of the plurality of magnetic control elements is respectively located in one of the plurality of recesses, and
  the plurality of magnetic control elements comprises:
    a first magnet attached to a bottom surface of a corresponding one of the plurality of protrusion elements; and a second magnet disposed in a corresponding one of the plurality of recesses and separated from the first magnet by a predetermined distance, the first magnet has a lower surface with a first polarity and the second magnet has an upper surface with the first polarity; and the lower surface of the first magnet faces the upper surface of the second magnet.

5. A wafer loading apparatus, comprising:

a plate adapted to support a wafer, wherein the plate comprises:
  an upper plate including a plurality of penetrating holes; and
  a bottom plate including a plurality of recesses each adapted to hold at least one of a plurality of magnetic control elements;

a plurality of protrusion elements disposed within the plate and partially extruding above the plate to support the wafer, wherein each of the plurality of protrusion elements comprises:
  a body portion surrounded by one of the plurality of penetrating holes formed in the plate;
  an extruding portion extruding above the plate to support the wafer, and
  a separation-preventing portion integrally formed with the body portion and surrounded by one of the plurality of recesses disposed below one of the plurality of penetrating holes to prevent the protrusion element from separating from the plate, wherein each one of the plurality of magnetic control elements is, respectively disposed under a corresponding one of the plurality of protrusion elements to control movement of the plurality of protrusion elements, such that a distance between a lower surface of the wafer and an upper surface of the plate is substantially uniform, and each one of the plurality of magnetic control elements comprises:
  a first magnet attached to a bottom surface of a protrusion element; and
  a second magnet disposed on a bottom surface of a recess,
  wherein the first magnet has a lower surface with a first polarity and the second magnet has an upper surface with the first polarity, and the lower surface of the first magnet faces the upper surface of the second magnet.

6. A wafer loading apparatus, comprising:

a plate adapted to support a wafer, wherein the plate comprises:
  an upper plate including a plurality of penetrating holes; and
  a bottom plate including a plurality of recesses adapted to hold at least one of a plurality of magnetic control elements;

a plurality of protrusion elements disposed within the plate and partially extruding above the plate to support the wafer, wherein each of the plurality of protrusion elements comprises:
  a body portion surrounded by one of the plurality of penetrating holes formed in the plate;
  an extruding portion extruding above the plate to support the wafer; and
  a separation-preventing portion integrally formed with the body portion and surrounded by one of the plurality of recesses disposed below one of the plurality of penetrating holes to prevent the protrusion element from separating from the plate, wherein each one of the plurality of magnetic control elements is, respectively disposed under a corresponding one of the plurality of protrusion elements to control movement of the plurality of protrusion elements, such that a distance between a lower surface of the wafer and an upper surface of the plate is substantially uniform, wherein the upper plate comprises:
  a first upper plate through which the plurality of penetrating holes is formed; and
  a second upper plate disposed between the first upper plate and the bottom plate and comprising a plurality of caging recesses respectively aligned with a corresponding one of the plurality of penetrating holes, wherein each caging recess has a larger diameter than the corresponding penetrating hole.

7. A wafer loading apparatus, comprising:

an upper plate including a plurality of penetrating holes;

a plurality of supporting elements having respective upper portions surrounded by one of the plurality of penetrating holes and adapted to support a wafer loaded on the upper plate;

a bottom plate located below the upper plate and surrounding lower portions of the plurality of supporting elements, the bottom plate including a plurality of recesses, each being respectively aligned with one of the plurality of penetrating holes; and a plurality of magnetic control elements respectively located in a plurality of recesses and adapted to control vertical movement of the respective supporting elements such that a distance between the lower surface of the wafer and an upper surface of the upper plate remains substantially uniform whenever the wafer is placed on the supporting elements wherein the upper plate comprises:
  a first upper plate in which the plurality of penetrating holes is formed; and
  a second upper plate sandwiched between the first upper plate and the bottom plate, the second upper plate including a plurality of caging recesses;

wherein each of the plurality of caging recesses is aligned with a corresponding one of the plurality of penetrating holes and each caging recess has a larger diameter than its corresponding penetrating hole.

8. The wafer loading apparatus of claim 7, wherein each of the magnetic control elements comprises:
  a first magnet attached to a bottom surface of one of the plurality of supporting elements; and,
  a second magnet placed in a bottom surface of one of the plurality of caging recesses at a predetermined distance from the first magnet;
  wherein the first magnet has a lower surface with a first polarity and the second magnet has an upper surface with the first polarity, and the lower surface of the first magnet faces the upper surface of the second magnet.

* * * * *